(12) United States Patent
Kitano et al.

(10) Patent No.: US 6,605,153 B2
(45) Date of Patent: Aug. 12, 2003

(54) COATING FILM FORMING APPARATUS

(75) Inventors: Takahiro Kitano, Kikuchi-gun (JP); Masateru Morikawa, Kikuchi-gun (JP); Yukihiko Esaki, Kikuchi-gun (JP); Nobukazu Ishizaka, Kikuchi-gun (JP); Norihisa Koga, Kikuchi-gun (JP); Kazuhiro Takeshita, Kikuchi-gun (JP); Hirofumi Ookuma, Kikuchi-gun (JP); Masami Akimoto, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 123 days.

(21) Appl. No.: 09/735,657

(22) Filed: Dec. 14, 2000

(65) Prior Publication Data
US 2001/0003967 A1 Jun. 21, 2001

(30) Foreign Application Priority Data
Dec. 17, 1999 (JP) ............................................. 11-359080

(51) Int. Cl.$^7$ ............................................... B05C 11/10
(52) U.S. Cl. .............................. 118/57; 118/56; 118/70; 118/320; 118/323
(58) Field of Search ................................ 118/50, 52, 56, 118/57, 301, 320, 321, 323, 504, 720, 721, 70; 427/240, 282, 425; 134/902

(56) References Cited
U.S. PATENT DOCUMENTS 5,927,306 A  * 7/1999  Izumi et al. ................. 134/155
6,416,583 B1 * 7/2002  Kitano et al. ............... 118/301

FOREIGN PATENT DOCUMENTS

JP          12-077326          3/2000

* cited by examiner

Primary Examiner—Richard Crispino
Assistant Examiner—George R. Koch, III
(74) Attorney, Agent, or Firm—Oblon, Spivak, McClelland, Maier & Neustadt, P.C.

(57) ABSTRACT

An apparatus includes a holding portion for holding a substrate, a nozzle, provided to face the substrate held by the holding portion, for discharging a solution to the substrate, a driver for moving the nozzle along a surface of the substrate relatively with respect to the substrate while the solution is being discharged to the surface of the substrate from the nozzle, a mask unit covering a portion other than a film formation area of the substrate and including a mask member for catching the solution from the nozzle, and a cleaner provided in the mask unit. The coating solution can be supplied to the surface of the substrate in a way similar to a picture drawn with a single stroke of a brush. A cleaning unit for cleaning the mask member does not need to be provided separately, leading to the facilitation of cleaning and a reduction in space.

8 Claims, 14 Drawing Sheets

COATING FILM FORMING APPARATUS

CROSS-REFERENCE TO RELATED APPLICATIONS

This application is based upon and claims the benefit of priority from the prior Japanese Patent Application No. 11-359080, filed Dec. 17, 1999, the entire contents of which are incorporated herein by reference.

BACKGROUND OF THE INVENTION

The present invention relates to a coating film forming apparatus for forming a coating film on a substrate such as a semiconductor wafer, an LCD substrate (a glass substrate for a liquid crystal display), or the like by applying a coating solution thereon.

In the process of fabricating a semiconductor device or an LCD, resist treatment is performed for a substrate by so-called photolithography. In this technology, a series of processes, for example, of coating a semiconductor wafer (hereinafter referred to as a wafer) with a resist solution to form a solution film on its surface, exposing the resist film through the use of a photo mask, and thereafter performing developing treatment to obtain a desired pattern are performed.

The coating process of the resist solution in the aforesaid processes has been hitherto performed by a so-called a spin coating method. This method is the following method: A rotatable spin chuck is provided in a cup surrounding the entire side thereof; a wafer is horizontally suction-held by the spin chuck; and a resist solution is spread by the centrifugal force of the wafer by supplying the resist solution onto the wafer W from a nozzle above the central portion of the wafer while rotating the wafer W to thereby form a solution film on the entire wafer.

However, the line width of a resist pattern formed is proportional to the film thickness of a resist film and exposure wavelength. Therefor, to cope with the formation of a finer pattern which has been demanded increasingly in recent years, it is necessary to make the solution film thinner as much as possible, and a thinner film can be obtained by increasing the rotation speed of the wafer in the spin coating method.

In the aforesaid method, however, the wafer is rotated at a high speed, and hence a peripheral speed at an outer peripheral portion is higher that that at an inner peripheral portion, thereby causing a problem that turbulence of air occurs at the outer peripheral portion specially when the wafer is increased in size. This turbulence causes film thickness to change to thereby make the film thickness on the entire wafer ununiform, thus hindering the formation of the finer pattern.

Further, since the resist solution is spread by being blown away from the central portion of the wafer W toward the peripheral edge thereof in this method, the amount of the resist solution wasted by scattering from the peripheral edge portion toward the cup is large. Furthermore, there arises a problem that the resist solution applied to portions such as the peripheral edge portion other than a circuit formation area and the resist solution adhering to the cup due to scattering are cured to thereby cause particles.

BRIEF SUMMARY OF THE INVENTION

For the aforesaid reasons, a coating unit without using the spin coating method is thought up. For example, a unit shown in FIG. 14 includes a mask 12 covering the entire area except a circuit formation area 11 of a wafer W and supplies a resist solution to the circuit formation area 11 only in a way similar to a picture drawn with a single stroke of a brush by supplying the resist solution to the wafer W from a nozzle 13 provided above the mask 12 with the nozzle 13 being reciprocatingly moved in an X-direction and the wafer W being intermittently moved in a Y-direction.

Since the wafer is not rotated in this unit, the aforesaid disadvantages are eliminated, whereby coating with no waste can be performed. However, the resist solution is discharged to the surface of the mask 12, and with the repetition of treatment, the thickness of the resist film increases and the resist film peels off, which causes particles. Hence, it is required to remove the mask 12 in predetermined timing, replace the mask 12 with a cleaned mask, and clean the contaminated mask 12 in a cleaning unit provided separately. Therefore, there arise problems that a space for cleaning the mask 12 and a space for making cleaned masks wait are necessary, resulting in an increase in the size of the unit, and that work is a troublesome since the mask 12 is cleaned after removed from the coating unit, and mounted in the coating unit after cleaned.

Meanwhile, a unit structured by providing masks 14a and 14b covering only a peripheral edge area corresponding to a scan area of the nozzle 13 at both ends in a moving direction (an X-direction) of the nozzle as shown in FIG. 15 in place of the mask 12 covering the entire peripheral edge portion of the wafer W and changing the distance between the masks 14a and 14b correspondingly to the width of a circuit formation area of the wafer by means of a drive mechanism 16 is thought. According to the structure like this, the nozzle 13 reciprocatingly moves in a fixed movement area, and thus the amount of the resist solution supplied to surfaces of the masks 14a and 14b per wafer is larger compared with the mask 12 shown in FIG. 14, resulting in the more frequent occurrence of particles.

The present invention is made in view of the aforesaid circumstances, and its object is to provide a coating film forming apparatus enabling a high yield of a coating solution, formation of a uniform coating film, moreover easy cleaning of a mask member covering an area other than a coating film formation area, and suppression of an increase in the size of the apparatus.

In view of the aforesaid object, a coating film forming apparatus of the present invention includes: a substrate holding portion for holding the substrate; a coating solution nozzle, provided to face the substrate held by the substrate holding portion, for discharging a coating solution to the substrate; a drive mechanism for moving the coating solution nozzle along a surface of the substrate relatively with respect to the substrate while the coating solution is being discharged to the surface of the substrate from the coating solution nozzle; a mask unit covering a portion other than a coating film formation area of the substrate and including a mask member for catching the coating solution from the coating solution nozzle; and a cleaning mechanism, provided in the mask unit, for cleaning a coating film adhering to the mask member.

According to the coating film forming apparatus of the present invention, the coating solution can be supplied to the surface of the substrate in a way similar to a picture drawn with a single stroke of a brush by the operation of the drive mechanism. Since the mask unit including the mask member for catching the coating solution from the coating solution nozzle and the cleaning mechanism, provided in the mask unit, for cleaning the coating film adhering to the mask member are provided, a cleaning unit for cleaning the mask member does not need to be provided separately, leading to the facilitation of cleaning and a reduction in space.

The drive unit, for example, may be structured to have an X-directional drive section for reciprocatingly moving the coating solution nozzle in an X-direction and a Y-directional drive section for intermittently moving the substrate in a Y-direction relatively with respect to the coating solution nozzle. The mask unit, for example, may be structured to be provided as a pair of mask units which face each other in the X-direction, and each of mask members of the pair of mask units moves in the X-direction correspondingly to the X-directional width of the coating film formation area, and moves in the Y-direction relatively with respect to the substrate correspondingly to the Y-directional relative movement of the coating solution nozzle with respect to the substrate.

The aforesaid structures allow the coating solution nozzle to reciprocatingly move in the X-direction while discharging the coating solution in the form of a line with a small diameter and allow the substrate to move in the Y-direction when the coating solution nozzle is positioned at a turning point, whereby the supply of the coating solution to the surface of the substrate can be performed easily in a way similar to a picture drawn with a single stroke of a brush.

In the present invention, it is preferable to provide a first suction mechanism for sucking a solvent supplied to the mask member and components (dissolved components) of the dissolved coating film, and moreover it is preferable to provide a second suction mechanism for sucking the solvent which spilled to a bottom face of a case body and the dissolved components. Thus, it becomes possible to remove the coating solution adhering to the mask member certainly.

The cleaning mechanism may be structured to include a solvent nozzle, provided separately from the mask unit, for discharging a solvent to the mask member to dissolve the coating film. For example, a structure in which the solvent nozzle is combined so as to move with the coating solution nozzle is also possible. Incidentally, an ultrasonic vibrator for applying an ultrasonic wave may be provided in the solvent nozzle.

Further, the coating film forming apparatus of the present invention can be structured to include a solvent supply section for supplying the solvent to the surface of the mask member so as to form a flow in the form of a film and a third suction mechanism, a suction port of which is formed in the surface of the mask member, for sucking the solvent and components of the dissolved coating film from this suction port.

Furthermore, a portion facing at least a movement area of the coating solution nozzle in the mask member may be structured by an absorber (cleaning mechanism) for absorbing the coating solution. This structure corresponds to the coating film formation area of the substrate and it is suitable for the mask member covering the entire peripheral edge portion of the substrate. In this case, a structure including a fourth suction mechanism for sucking the coating solution absorbed by the absorber is desirable.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
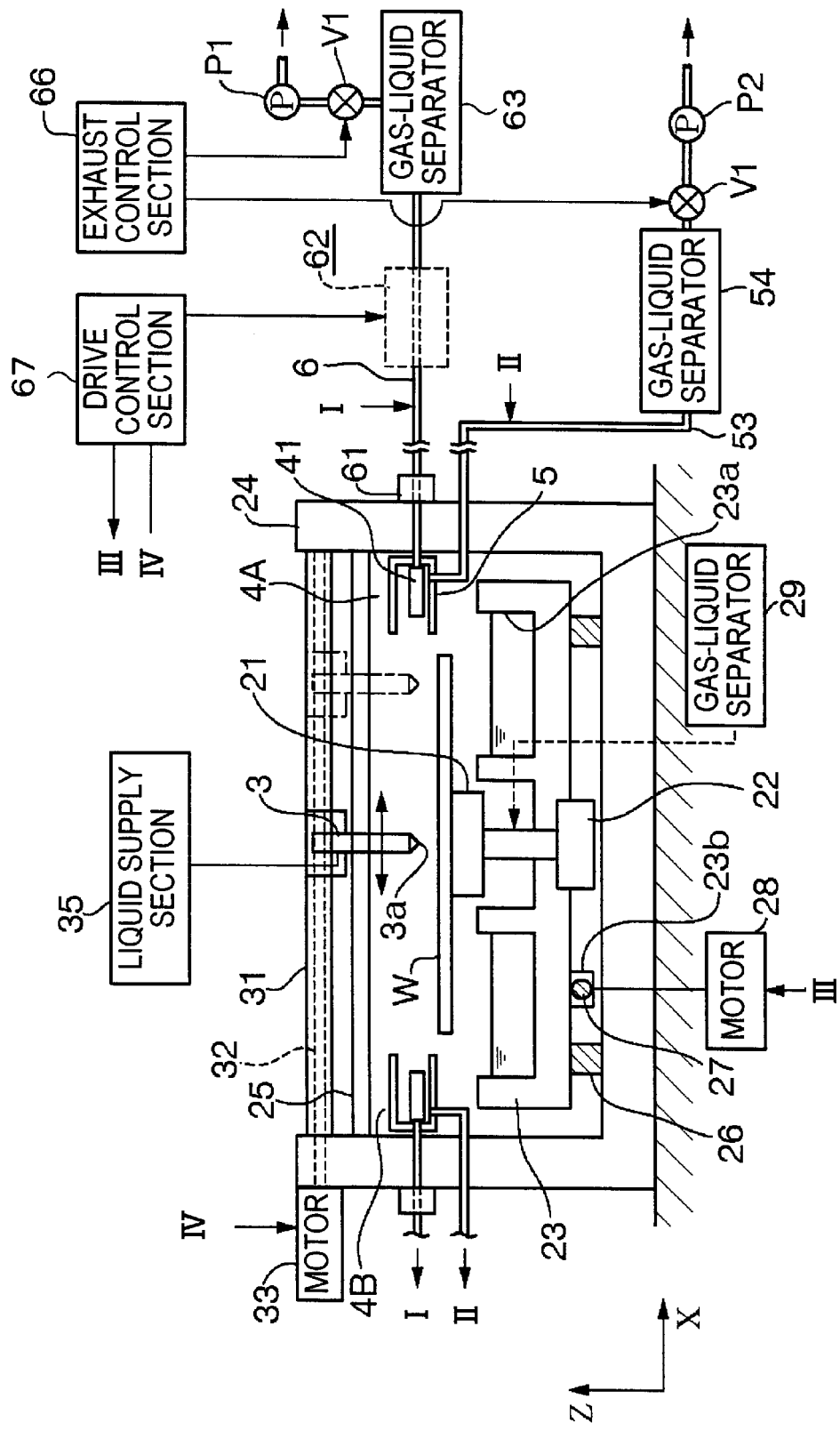
FIG. 1 is a block diagram of a coating film forming apparatus which is an embodiment of the present invention.
Figure 2:
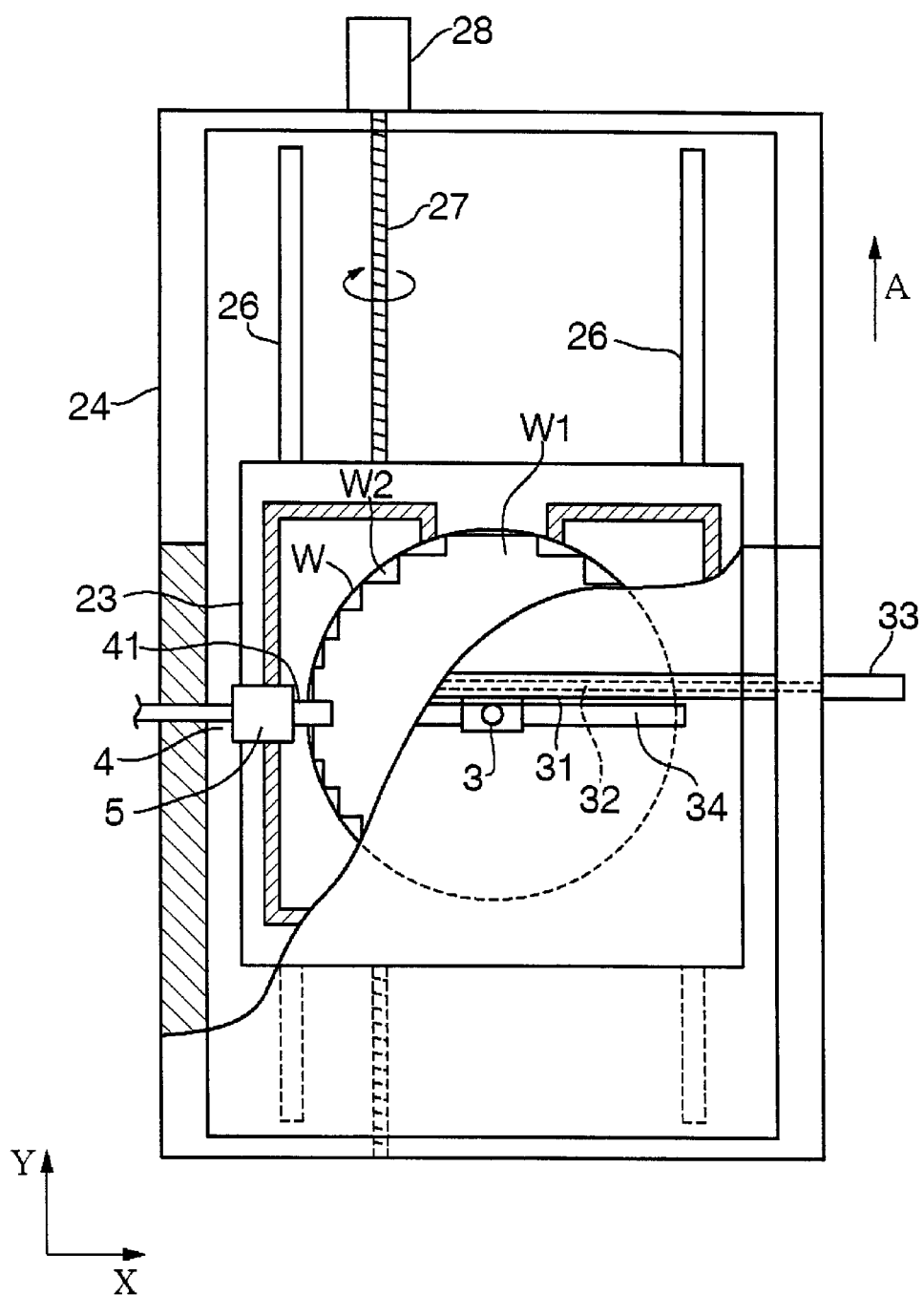
FIG. 2 is a plan view of the coating film forming apparatus in FIG. 1.

FIGS. 1 and 2 are a schematic sectional view and a schematic plan view respectively showing a coating film forming apparatus which is an embodiment of the present invention. A wafer W which is a substrate is held almost horizontally by a substrate holding portion 21, and the substrate holding portion 21 is structured to be ascendable and descendable, for example, between a carrier arm not illustrated and the substrate holding portion 21 by a hoisting and lowering mechanism 22. The substrate holding portion 21 and the hoisting and lowering mechanism 22 are structured integrally with a tray-shaped liquid catcher 23. The surface of the liquid catcher 23 is opposite to a reverse surface of the wafer W, and a recessed portion 23a for storing a solvent, for example, a thinner solution is formed therein. The temperature of the solvent is controlled in the recessed portion 23a so that the periphery of the wafer W is maintained in an atmosphere of a solvent with a predetermined concentration with a part of the solvent being vaporized.

The liquid catcher 23 is surrounded by a casing 24 only the upper face of which is open and a lid body 25 for covering an opening portion at a position slightly lower than the upper end of the casing 24, and a temperature regulating means not illustrated for regulating the temperature of a coating solution in a coating solution nozzle 3 which will be described later is provided in the lid body 25. Two rails 26 which extend in a Y-direction are laid on an inner bottom face of the casing 24, and a ball screw 27 is provided in the vicinity of the bottom face so as to penetrate opposite side faces of the casing 24 and parallel the rails 26. The ball screw 27 is tightened into a nut portion 23b provided at the lower end of the liquid catcher 23, and a motor 28 rotates the ball screw 27 so that the liquid catcher 23 is guided by the rails 26 to move in the Y-direction. The substrate holding portion 21 is connected to a vibration generating section 29, which enables the formation of a flat coating film by giving vibration to the coating solution lineally supplied onto the surface of the wafer W by the coating solution nozzle 3 which will be described later.

Next, a region above the substrate holding portion 21 will be explained. A guide member 31 which extends in an X-direction is laid in the vicinity of the upper end of the casing 24, and the coating solution nozzle 3 for supplying the coating solution to the wafer W is provided in the guide member 31 so as to be guided. The guide member 31 has a ball screw 32 therein, and a motor 33 provided on an outer wall of the casing 24 rotates the ball screw 32 so that the coating solution nozzle 3 moves in the X-direction.

A discharge port 3a with a diameter of 10 μm to 20 μm, for example, is formed to face the wafer W at the lower end of the coating solution nozzle 3. In the lid body 25, a slit-shaped opening 34 is formed in a movement area of the coating solution nozzle 3, and the coating solution nozzle 3 is structured so that the discharge port 3a moves under the lid body 25 through the opening 34.

A resist solution which is the coating solution and a solvent such as a thinner solution for preventing the volatilization of the resist solution are supplied from a liquid supply section 35 to the coating solution nozzle 3 after their temperatures and supply amounts are regulated. For example, the resist solution is sent out from an inner tube of a double tube not illustrated in the coating solution nozzle 3 to the discharge port 3a and the thinner solution in the form of mist is sent out from an outer tube thereof to the discharge port 3a, and both of them are simultaneously supplied to the wafer W in such a manner that a mist of the solvent surrounds the resist solution.

The motor 33, the ball screw 32, the guide member 31, and the like here correspond to an X-directional drive section in "What is claimed is" for example, and the motor 28, the ball screw 27, the nut portion 23b, the rails 26, and the like correspond to a Y-directional drive section. Owing to driving force from these sections, the coating solution nozzle 3 moves in the X-direction, and the wafer W being opposite thereto moves in the Y-direction, which enables the relative movement of the coating solution nozzle 3 and the wafer W in the X- and the Y-direction.

Next, the structure of a mask unit 4 provided by the side of the wafer W will be explained with reference to FIGS. 3 to 6B. The mask unit 4 is composed of a pair of mask units 4A and 4B which face each other in the X-direction and have the same shape, and thus they will be explained here as the mask unit 4 unless they need to be described particularly. The mask unit 4 includes a mask member 41 for catching the resist solution supplied outside a coating film formation area of the wafer W from the coating solution nozzle 3 and a square rod-shaped case body 5 a side face of which on the side of the wafer W (As for the mask unit 4, this side is defined as the front hereinafter.) is open so that the mask member 41 is housed therein. The mask member 41 is horizontally supported by a hollow supporting portion 6 which is inserted into the case body 5 via a hole portion 51 in a back face of the case body 5.

Figure 6A:
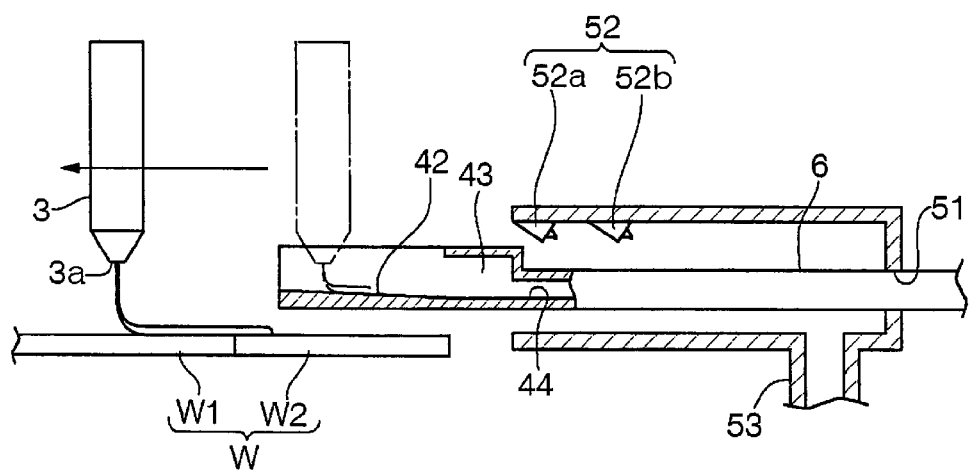
FIGS. 6A and 6B are vertical sectional views for explaining the motion of the mask unit when a resist solution is supplied by the coating solution nozzle.
Figure 6B:
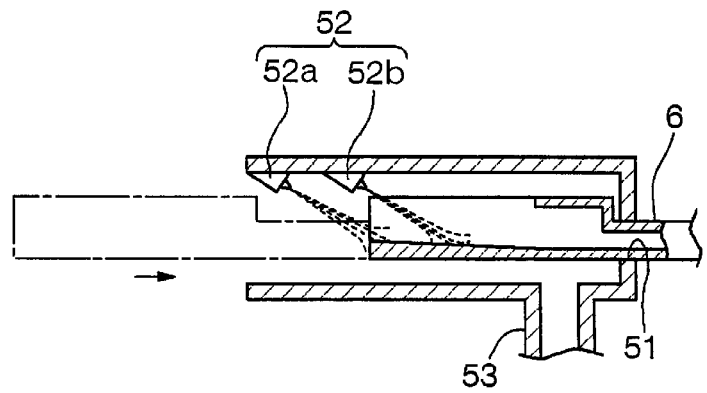

The mask member 41 is structured in this example as a tray-shaped member including a liquid catching plate 42 the surface of which inclines slightly backward so that the resist solution flow smoother and side walls 43 which surround the sides and the back of the liquid catching plate 42. The distance between the back portions of the side walls 43 decreases toward the back as shown in FIGS. 6A and 6B, and the back end portions of the side walls 43 are connected to the supporting portion 6. The supporting portion 6 supports the mask member 41 and functions as a drain pipe for exhaust and drainage.

The liquid catching plate 42 is positioned at a level between the levels of the discharge port 3a of the coating solution nozzle 3 and the surface of the wafer W, and a hydrophilic member, for example, polypropylene is used as its material so as to raise cleaning effect thanks to the spread of a cleaning solution such as thinner being a solvent, which will be described later, over the surface thereof.

Figure 3:
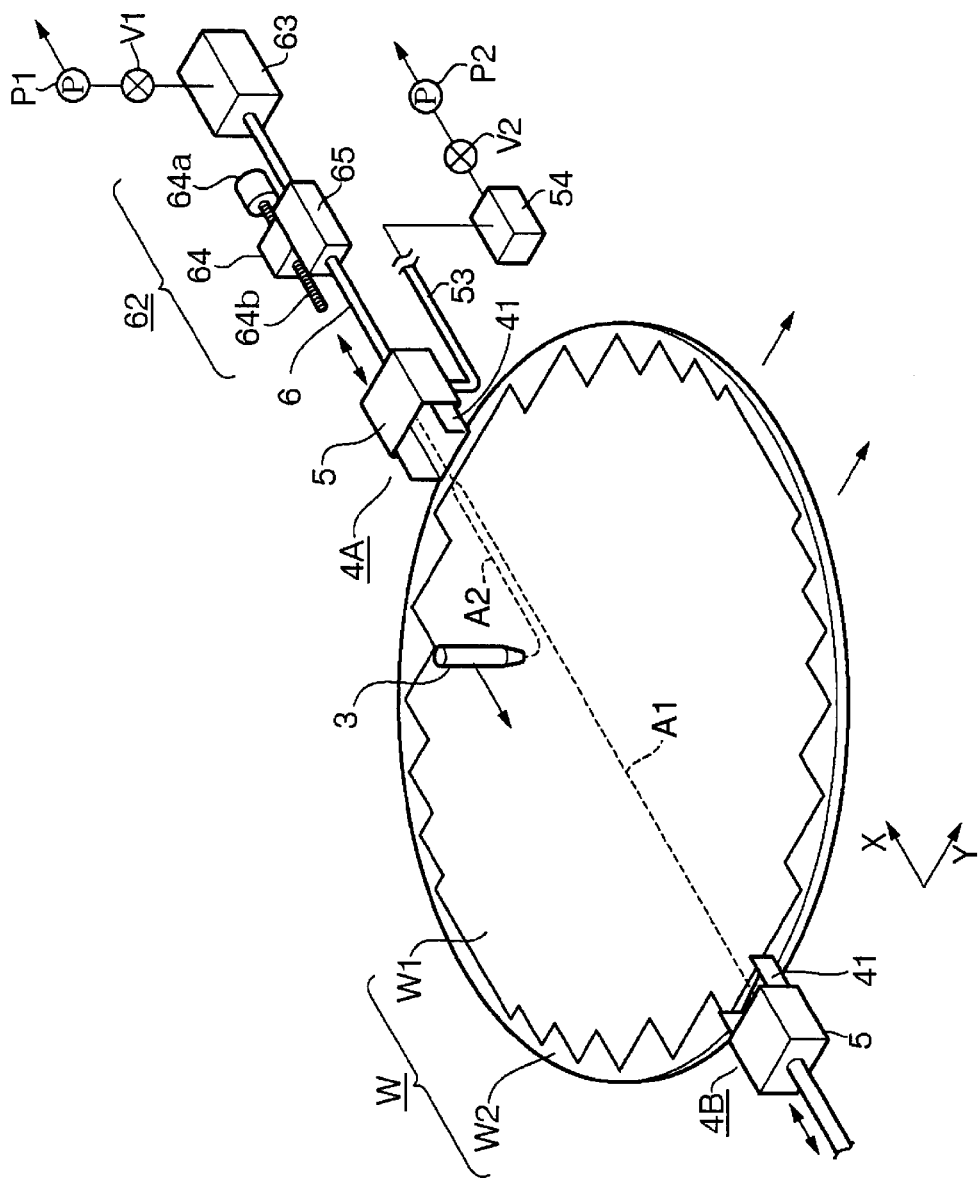
FIG. 3 is a perspective view for explaining the relative movement relationship between a coating solution nozzle and a wafer.

The downstream side of the supporting portion 6 communicates with a gas-liquid separator 63 through a side wall of the casing 24, for example, via a bearing 61 provided on the outside of the side wall and an advancing and retreating means 63. In the advancing and retreating means 62, for example, a ball screw mechanism 64 is used as shown in FIG. 3, and a ball screw 64b is rotated by a motor 64a to thereby advance and retreat the supporting portion 6 in the X-direction with a nut portion 65 fitting with the ball screw 64b being guided by a guide not illustrated. A portion from the advancing and retreating means 62 to the gas-liquid separator 63 of the supporting portion 6 is formed of, for example, a flexible tube, and the downstream side of the advancing and retreating means 62 of the supporting portion 6 can cope with the advance and retreat of a portion on the upper stream side thereof.

A suction pump P1 is connected to the downstream side of the gas-liquid separator 63 via a valve V1, and timing of suction, suction forth, and the like can be controlled by the control of the opening and closing of the valve V1 by means of an exhaust control section 66 connected to the valve V1.

Figure 4:
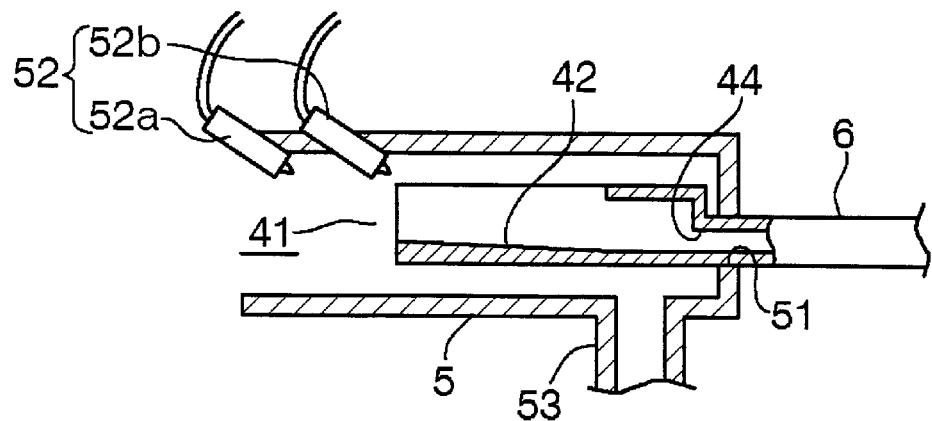
FIG. 4 is a vertical sectional view for explaining the structure of a mask unit.
Figure 5:
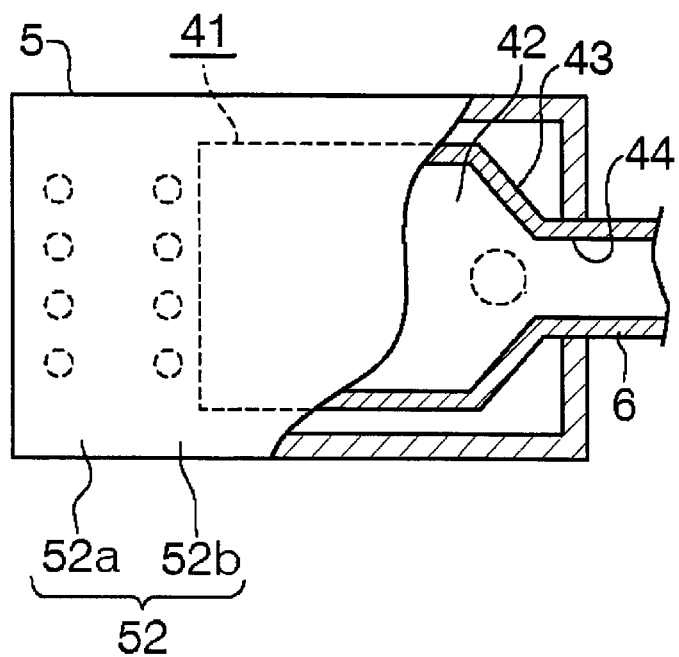
FIG. 5 is a plan view for explaining the structure of the mask unit.

Next, the case body 5 will be explained with reference to FIGS. 4 and 5. The case body 5 is formed to have a size enough to house the mask member 41 when the supporting member 6 retreats, and is provided with a solvent nozzle 52, which is a cleaning mechanism for supplying the solvent, for example, the thinner solution to the surface of the liquid catching plate 42 to dissolve the resist solution when the mask member 41 is housed therein, at its ceiling portion. The solvent nozzles 52 are arranged, for example, at a plurality of points in two rows in front and behind (eight points for convenience in FIG. 5). These solvent nozzles 52 are structured to discharge the solvent diagonally backward, and when the solvent nozzle at the front row is 52a and the solvent nozzle at the back row is 52b here, the solvent nozzle 52a is positioned to supply the thinner solution to a front end portion of the liquid catching plate 42, and the solvent nozzle 52b is positioned to supply the thinner solution to a central portion of the liquid catching plate 42.

Meanwhile, a drain pipe 53 is connected to a bottom face on the back side of the case body 5. The drain pipe 53 communicates with a gas-liquid separator 54 through the casing 24 as shown in FIG. 1, and a pump P2 is provided on the downstream side of the gas-liquid separator 54 via a valve V2. The drain pipe 53 is to suction the thinner solution which has dripped, for example, from the front end portion of the mask member 41 to the bottom face of the case body 5 and dissolved components during cleaning, and the suction pressure thereof and the like are controlled by the exhaust control section 66.

The drive parts such as the motor 28, the motor 33, the motor 64a which have been explained above in this embodiment are connected to a drive control section 67, and the drive control section 67 includes a function of conjointly advancing and retreating the respective mask members 41 of the mask units 4A and 4B with a predetermined stroke according to the Y-directional position of the wafer W, and the like.

A first suction mechanism in "What is claimed is" corresponds to the supporting portion 6, the gas-liquid separator 63, and the pump P1, and a second suction mechanism therein corresponds to the drain pipe 53, the gas-liquid separator 56, and the pump P2 in this embodiment for example.

Next, operation in the aforesaid embodiment will be explained. First, the substrate holding portion 21 is situated in a load area where the lid body 25 does not exist, and raised to receive the wafer W from the carrier arm not illustrated. Then, the liquid catcher 23 is moved in the Y-direction so that the edge portion in the Y-direction of the wafer W is situated below an area where the coating solution nozzle 3 moves in the X-direction. Subsequently, the resist solution is applied by moving the coating solution nozzle 3 in the X-direction and intermittently moving the wafer W in the direction of the arrow A in FIG. 2.

This supply of the resist solution will be described in detail with reference to FIG. 3. As described above, the coating solution nozzle 3 is reciprocatingly moved in the X-direction while discharging the resist solution in the form of a fine line onto the surface of the wafer W. An area where an integrated circuit is formed, that is, a coating film formation area W1 of the surface of the wafer W is formed to have a stepped outer edge, and hence the coating solution nozzle 3 moves for a distance corresponding to the X-directional width of the coating film formation area W1 and turns back outside the coating film formation area W1. The wafer W is stopped while the coating solution nozzle 3 discharges the coating solution to the coating film formation area W1, and intermittently moves in the Y-direction (in the direction of the arrows in this example) with the liquid catcher 23 while the coating solution nozzle 3 turns back at a position above the liquid catching plate 42 of the mask member 41 to prepare for the coating of the next area. After turning back, the coating solution nozzle 3 moves in the opposite direction while discharging the coating solution. By continuing this motion, the entire coating film formation area W1 of the wafer W is coated with the resist solution in a way similar to a picture drawn with a single stroke of a brush.

Now, the operation of the mask unit 4 in the coating process of the resist solution will be explained. When the resist solution is supplied by the coating solution nozzle 3, the front end of the mask member 41 is situated at a position slightly outwardly away from the outer edge of the coating film formation area W1, as shown in FIG. 6A. This is designed to secure the uniformity of a film thickness near the outer edge of the coating film formation area W1 by continuing to apply the resist solution for a little while after the coating solution nozzle 3 passes the outer edge of the coating solution formation area W1. As shown in FIG. 6B, the resist solution is applied on the surface of the mask member 41 after being applied to the outside of the coating film formation area W1 on the wafer W to some extent. Since the coating film formation area W1 on the surface of the wafer W is formed to have the stepped outer edge as described above, the advance and retreat control is performed so that the mask member 41 is situated at a position corresponding to the width of the coating film formation area W1 to be coated by the coating solution nozzle 3.

In such an embodiment, when a gap is produced between lines formed continuously by the coating solution, for example, like A1 and A2 in FIG. 3, vibration is given to the substrate holding portion 21 by the vibration generating section 29, for example, after the supply of the resist solution to the entire coating film formation area W1 is completed, whereby the thickness of the resist film is made uniform. The wafer W is then moved to a load/unload position and carried out from the position.

The forming process of the resist film is thus performed for the wafer W, in which case the mask member 41 retreats and is housed in the case body 5 in predetermined timing, for example, after one wafer W is coated or two or more wafers W are coated, and then the mask member 41 is cleaned. Namely, the thinner solution discharged from the solvent nozzles 52 dissolves the resist film adhering to the surface of the mask member 41. Effects produced by the discharge force of the thinner solution discharged from the solvent nozzles 52 and an inclination formed on the liquid catching plate 42 combine so that the thinner solution and dissolved components of the resist film dissolved by the thinner solution are swept away to the back side of the liquid catching plate 42 and flows to a hollow portion inside the supporting portion 6. At this time, suction to the downstream side is performed in the supporting portion 6, and hence the thinner solution and the dissolved components gathered at a position near the back end portion of the liquid catching plate 42 are certainly collected to the down stream side by this suction force.

The thinner solution discharged from the solvent nozzle 52a dissolves the resist film formed at the front end of the mask member 41, and the thinner solution and a part of the dissolved components, particularly the thinner solution discharged to a vertical portion of the front end and the dissolved components thereof flow downward from the front end portion of the mask member 41. These solutions flow backward along the inclined bottom face of the case body 5 and are collected into the drain pipe 53. Incidentally, the discharge amount of the thinner solution and cleaning time are set by a control section not illustrated, for example, according to the flow rate of the resist solution to be supplied from the coating solution nozzle 3.

As described above, the coating film forming apparatus according to this embodiment has the following effects. Namely, the resist solution is applied onto the wafer W by the coating solution nozzle 3 in a way similar to a picture drawn with a single stroke of a brush, and thus the yield of the resist solution can be remarkably increased as compared with that by the spin coating method, and the occurrence of turbulence of air by the rotation of the wafer W can be eliminated, thereby producing effects including high uniformity of film thickness. Moreover, the application of the resist solution onto the peripheral edge portion of the wafer W is prevented by the mask member 41, which can prevent the resist film from peeling off the peripheral edge portion of the wafer W and prevent the reverse surface of the wafer W from being contaminated, whereby there is no possibility of contaminating the carrier arm and the like.

Further, the solvent nozzles 52 are provided in the mask unit 4 (4A, 4B), the resist film adhering to the mask member 41 is dissolved by the solvent from the solvent nozzles 52, and the solvent and the dissolved components are sucked and drained via the supporting portion 6 and the drain pipe 53, which makes it possible to suppress the occurrence of particles due to the peeling of the resist film adhering to the mask member 41. The cleaning mechanism composed of the solvent nozzles 52, the supporting portion 6, the drain pipe 53, and the like is provided in the mask unit 4, whereby a cleaning section does not need to be provided separately, which can save space, resulting in the prevention of the apparatus from increasing in size, and also can save the trouble of removing the mask unit 4 from the coating film forming apparatus, cleaning it, and attaching it to the coating film forming apparatus, resulting in the facilitation of cleaning operation.

The cleaning of the mask member 41 in this embodiment may be performed by discharging the solvent while moving the mask member 41 back and forth, or by discharging the thinner solution in the form of foam from the solvent nozzles 52, or by discharging the solvent with the provision of an ultrasonic vibrator which applies ultrasonic waves to the solvent, and the resist film formed on the surface of the mask member 41 can be removed more certainly by combining these methods to the aforesaid embodiment.

Figure 7:
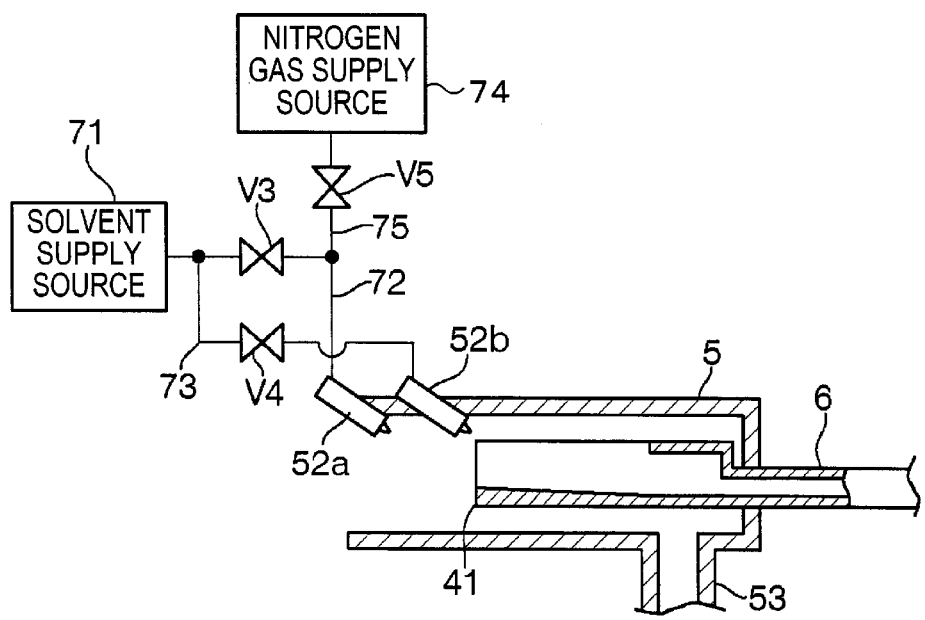
FIG. 7 is an explanatory view showing the structure of a cleaning mechanism for cleaning a mask member.

Further, a gas nozzle for supplying a purge gas for drying the mask member 41 which has been cleaned (a drying gas supply section) may be provided in the case body 5 in this embodiment. As for the structure thereof, for example, a gas nozzle may be provided separately from the solvent nozzles 52, or a part of the solvent nozzles 52, for example, the solvent nozzle 52a may be structured to also serve as a gas nozzle. FIG. 7 is an explanatory view showing such an embodiment. A supply pipe 72 is laid from a solvent supply source 71 to the solvent nozzle 52a via a valve V3, and a supply pipe 73 is laid therefrom to the solvent nozzle 52b via a valve V4. A supply pipe 75 is connected from a nitrogen (N2) gas supply source 74, which is the drying gas supply section, to a portion of the supply pipe 72 between the valve V3 and the solvent nozzle 52a via a valve V5.

According to the structure like this, the thinner solution, for example, is supplied from the solvent nozzles 52a and 52b to the mask member 41 to dissolve the coating film with the valves V3 and V4 open and the valve V5 closed, thereafter the valves V3 and V4 are closed and the valve V5 is opened, and nitrogen gas is supplied from the solvent nozzle 52a to the mask member 41, whereby the mask member 41 can be dried, and consequently the time required for the cleaning process of the mask member 41 can be shortened.

Figure 8:
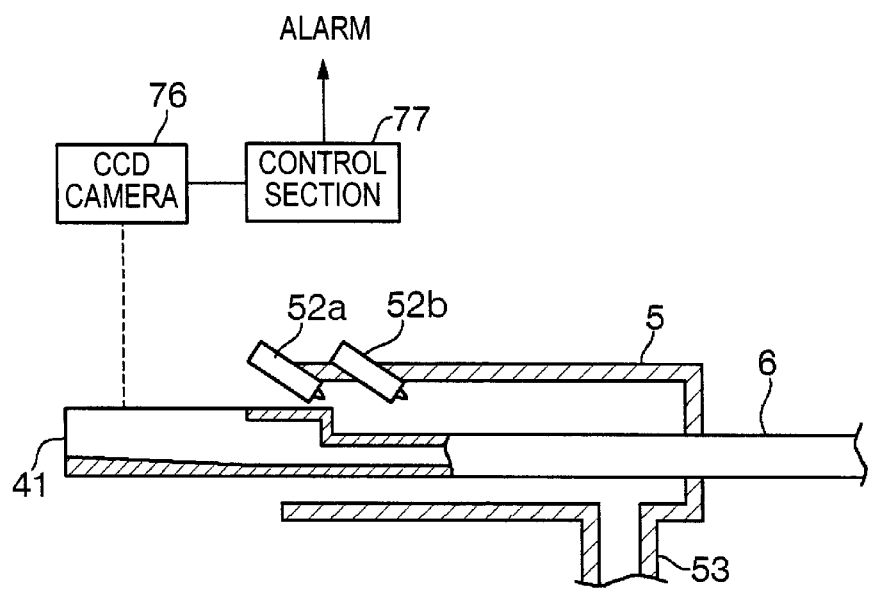
FIG. 8 is an explanatory view showing a structure for observing the contamination degree of the mask member.

Further, in the cleaning process of the mask member 41 in this embodiment, as shown in FIG. 8, a CCD camera 76, for example, for detecting the contamination degree of the mask member 41 may be provided above the same mask member 41, and an alarm may be raised when a control section 77 provided outside the apparatus judges that the contamination degree reaches to a predetermined contamination degree, and furthermore, a structure in which the cleaning of the mask member 41 is automatically started by outputting an command to the control section not illustrated for the solvent nozzles 52 is also suitable. By the aforesaid structure, the resist film formed on the surface of the mask member 41 can be dissolved before the resist film thickens to the extent that particles occur, and the cleaning of the mask member 41 more than necessary can be avoided as well.

Figure 9:
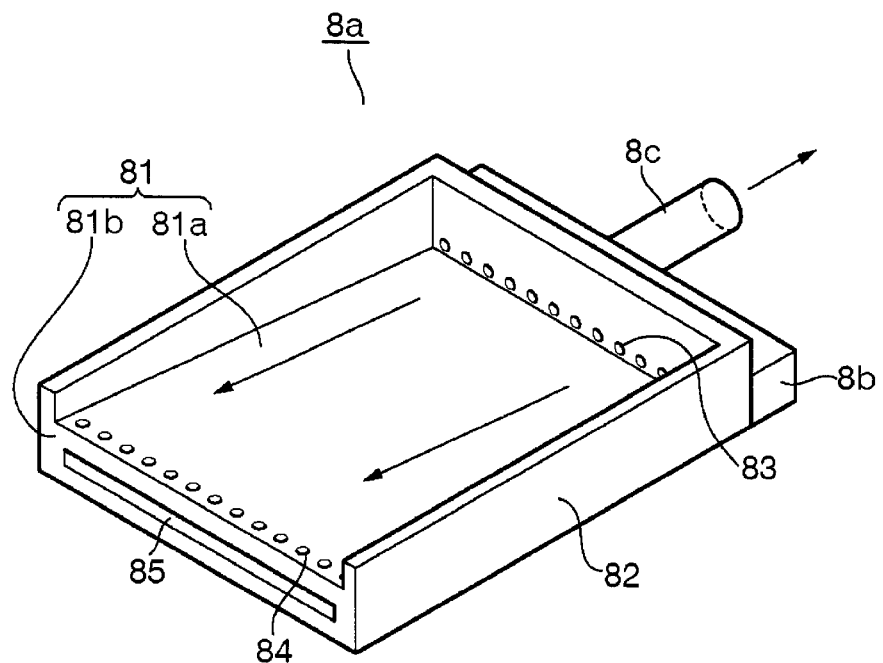
FIG. 9 is a perspective view of a mask member in another embodiment.
Figure 10:
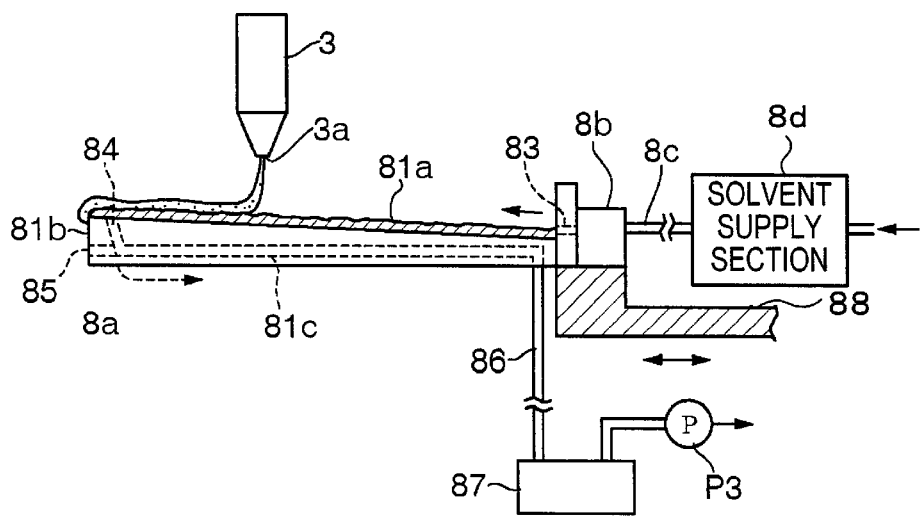
FIG. 10 is a vertical sectional view for explaining the operation of the embodiment shown in FIG. 9.

The present invention can have structures other than the embodiment hitherto explained (the first embodiment), and outlines of these structures will be given below. FIG. 9 is a schematic perspective view showing a mask unit 8 according to a second embodiment, and FIG. 10 is an explanatory view of operation through the use of a schematic sectional view of the mask unit 8. The mask unit 8 is composed of a pair of units similarly to the mask unit in the first embodiment, and only the mask unit on one side will be explained now.

The numeral 81 is a liquid catching plate the top face of which forms a liquid catcher. The top face inclines backward, and the liquid catching plate 81 is surrounded by a side wall 82 except the front thereof to form a mask member 8a. A top face 81a and a front end face 81b (a vertical portion at the front end thereof) of the liquid catching plate 81 are formed of a hydrophilic member so that the solvent spreads easily. A buffer portion 8b is provided at the back of the mask member 8a, and temporarily stores a solvent, for example, a thinner solution sent from a solvent supply section 8d via a supply pipe 8c. Discharge holes 83, for example, composed of many hole portions are formed in the width direction of the liquid catching plate 81 in a lower end portion on the back side of the side wall 82, and structured to discharge the solvent forward.

Meanwhile, many suction holes 84 are formed in the width direction in a front end portion of the top face 81a of the liquid catching plate 81, and a slit-shaped opening 85 is formed in the width direction in the front end face 81b. The suction holes 84 and the opening 85 communicate with a flow path 81c formed inside the liquid catching plate 81, and the flow path 81c is connected to a drain pipe 86 at the back side. A gas-liquid separator 87, a pump P3, and the like are provided on the down stream side of the drain pipe 86 as in the first embodiment. Incidentally, the numeral 88 in FIG. 10 is a supporting member for moving the mask member 8a forward and backward. The suction holes 84, the opening 85, the drain pipe 86, the gas-liquid separator 87, and the pump 3 here correspond to a third suction mechanism in "What is claimed is". Moreover, the solvent supply section 8d, the supply pipe 8c, the buffer portion 8b, and the discharge holes 83 correspond to a cleaning mechanism in "What is claimed is".

Next, the operation and effects of this embodiment will be explained. The solvent discharged from the discharge holes 83 spreads so as to cover the entire top face of the liquid catching plate 81, flows in the form of a film, and is sucked from the suction holes 84 near the front end. This supply of the solvent is performed continuously, for example, while the resist solution is discharged from the coating solution nozzle 3. Accordingly, in the mask member 8a, the resist solution discharged to the liquid catching plate 81 is sucked from the suction holes 84 with the flow of the solvent and removed since the flow of the solvent in the form of a thin film is formed at a portion to which the resist solution is supplied. The front end face 81b is formed of a hydrophobic member, and the opening 85 which is a suction means is provided therein, whereby even if the resist solution adheres to the front end face 81b, the resist solution flows downward and is sucked into the opening 85. Thus, the mask member 8a is constantly cleaned, and the cleaning mechanism thereof is provided in the mask unit, thereby producing the same effects as in the aforesaid embodiment.

Figure 11:
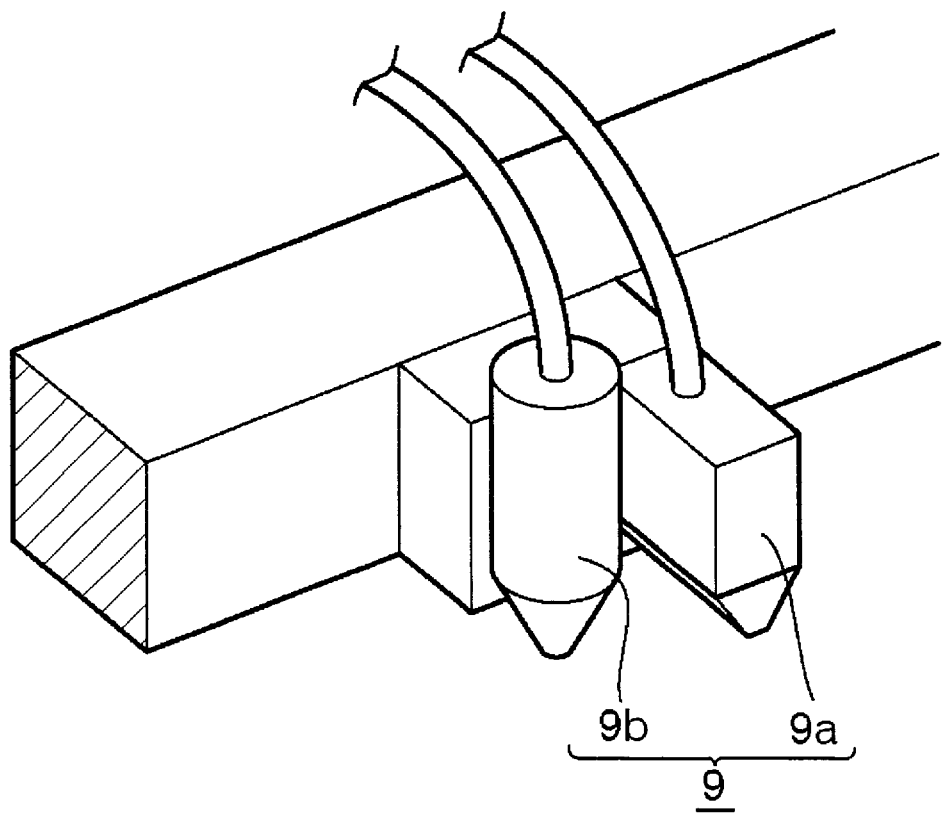
FIG. 11 is a perspective view of a nozzle unit in still another embodiment.
Figure 12:
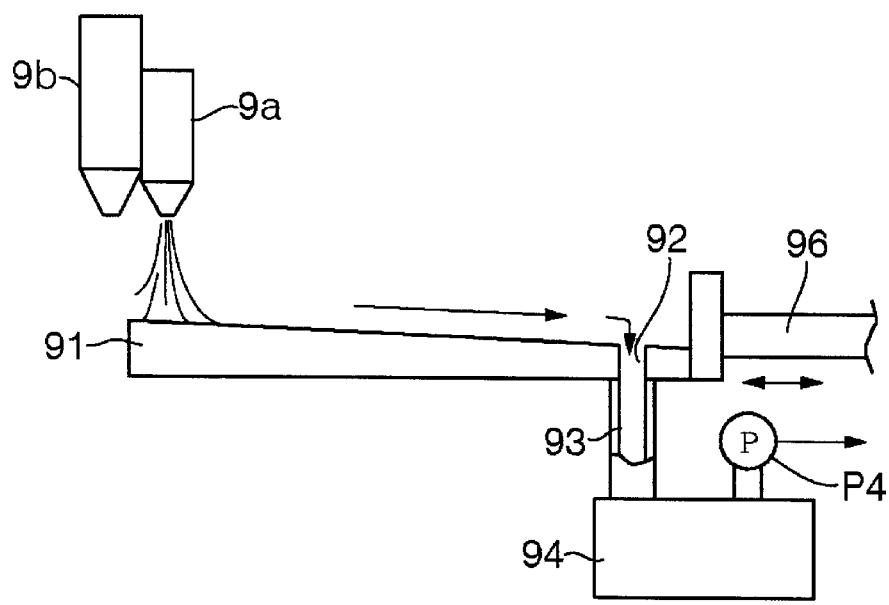
FIG. 12 is a vertical sectional view for explaining the operation of the embodiment shown in FIG. 11.

FIGS. 11 and 12 show a third embodiment. A nozzle unit 9 is composed by combining a solvent nozzle 9a not with a mask member but with a coating solution nozzle 9b. The numeral 91 is a mask member the surface of which inclines backward, and the mask member 91 is structured so that exhaust and drainage are performed through a drain pipe 93 which constitutes a suction mechanism connected to a hole portion 92 formed near the back end thereof. A gas-liquid separator 94, a pump P4, and the like are provided on the downstream side of the drain pipe 93. The mask member 91 is horizontally supported by a supporting member 96 and freely advances and retreats in the X-direction by an advancing and retreating means not illustrated as in the first and second embodiments.

In the aforesaid structure, after the completion of the coating film forming process, the nozzle unit 9 first moves to a point near the front end of the mask member 91 and discharges a solvent, for example, a thinner solution to clean the surface of the mask member 91. In the structure like this, the mask member 91 does not need to be removed and cleaned separately, thereby producing the same effects as in the aforesaid embodiments. Incidentally, in this case, it is suitable that a drying gas supply source is connected to the solvent nozzle 9a, whereby the mask member 91 is dried by N2 gas, for example, after the discharge of thinner as in the structure of the aforesaid embodiment in FIG. 7. Furthermore, separately from the nozzle unit 9, the solvent nozzle may be provided, for example, above the mask member 91 so as to be ascendable and descendable.

Figure 13:
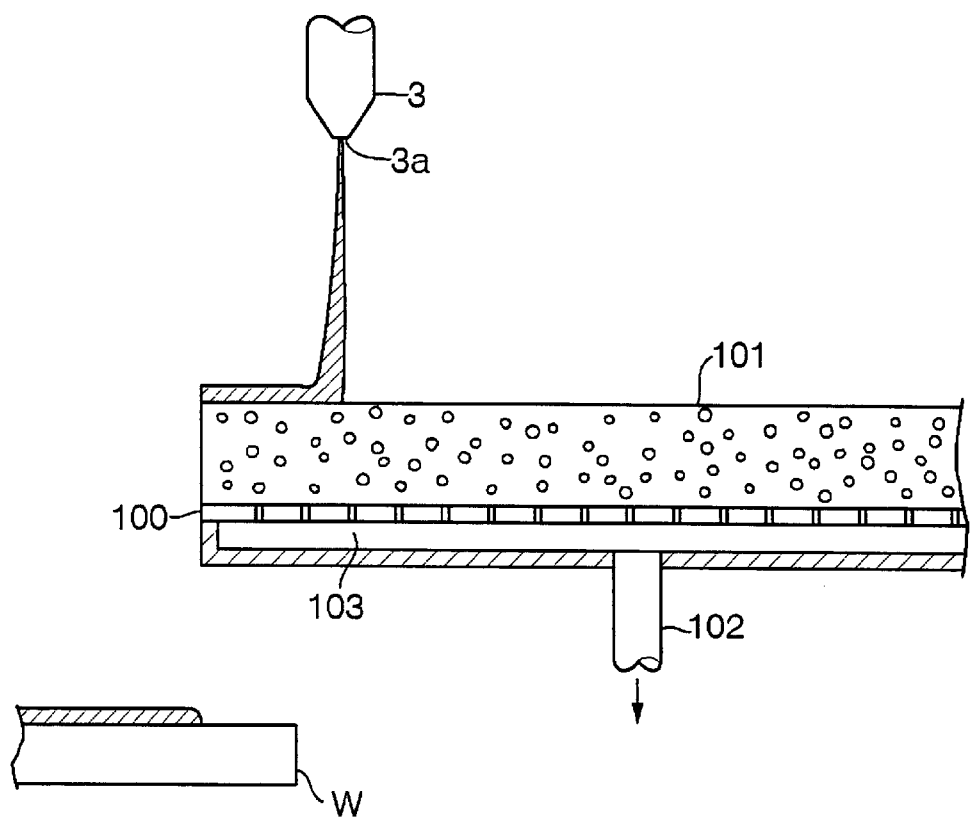
FIG. 13 is a schematic explanatory view showing a structure in which an absorber is provided in a mask member.
Figure 14:
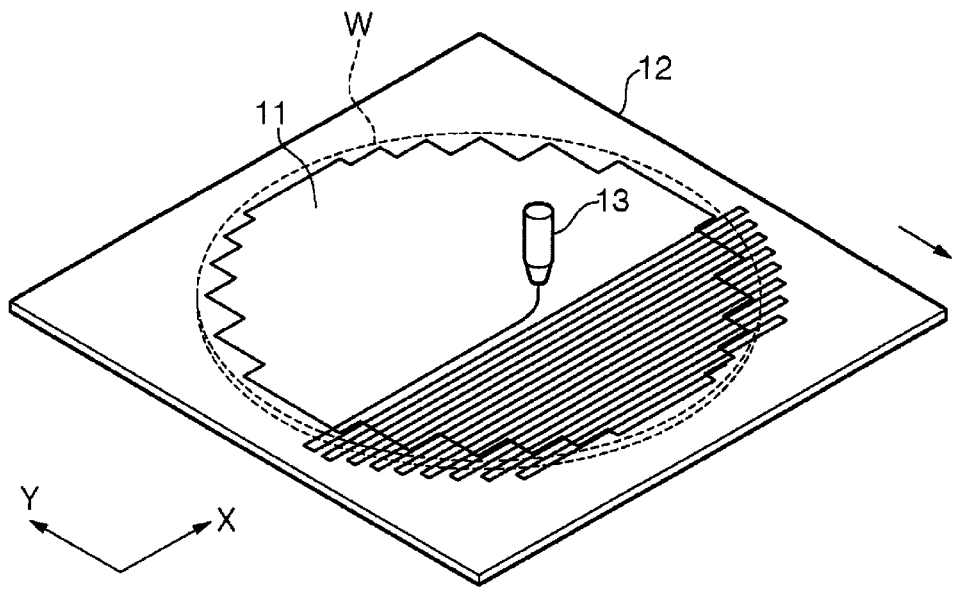
FIG. 14 is a perspective view showing an example of a coating film forming apparatus in which a spin coating method is not used.
Figure 15:
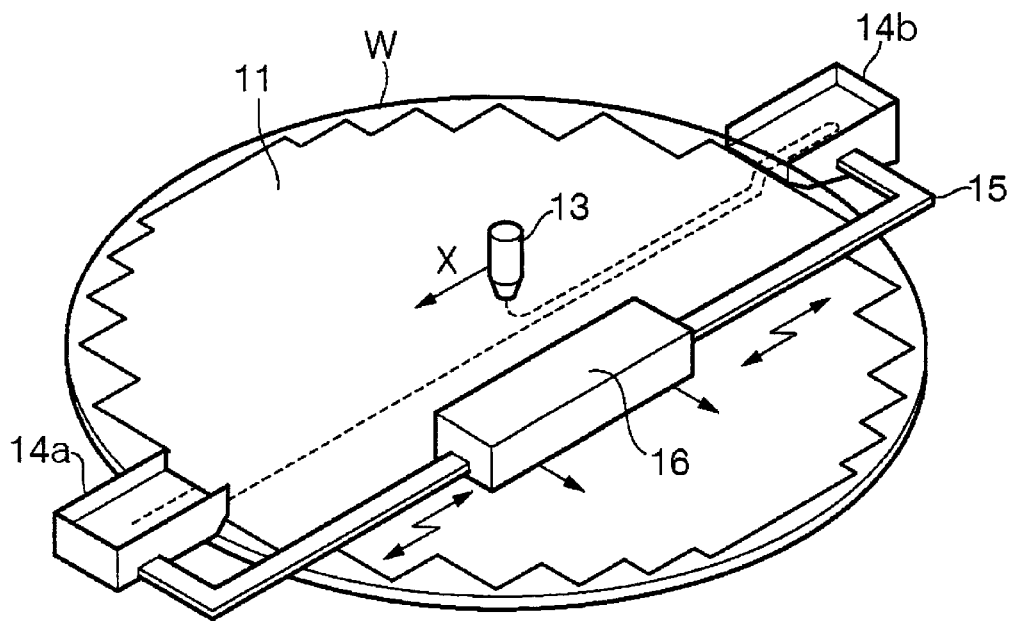
FIG. 15 is a perspective view showing another example of the coating film forming apparatus in which the spin coating method is not used.

The shape of the mask member is not limited to the aforesaid shapes, and as shown in FIG. 3 which is already described, a ring-shape which surrounds the entire peripheral edge portion of the wafer W so that a portion corresponding to the coating film formation area W1 of the wafer W is open is suitable. In this case, as shown in FIG. 13, it is suitable that an absorber 101, for example, made of porous polypropylene, which constitutes a surface portion is laminated on a perforated plate 100, and that a ventilation space 103 communicating with a suction pipe 102 is formed under the perforated plate 100. In this case, the resist solution discharged to the absorber 101 is absorbed by the absorber 101, and sucked and drained by the suction pipe 102 through the perforated plate 100 and the ventilation space 103, thereby maintaining the cleanness of the surface of the mask member. Incidentally, when a part of the resist solution remains in the absorber 101 and the absorber is contaminated, replacement is recommendable. In this example, a cleaning mechanism is composed of the absorber 101, the perforated plate 100, the ventilation space 103, and the suction pipe 102.

Figure 16:
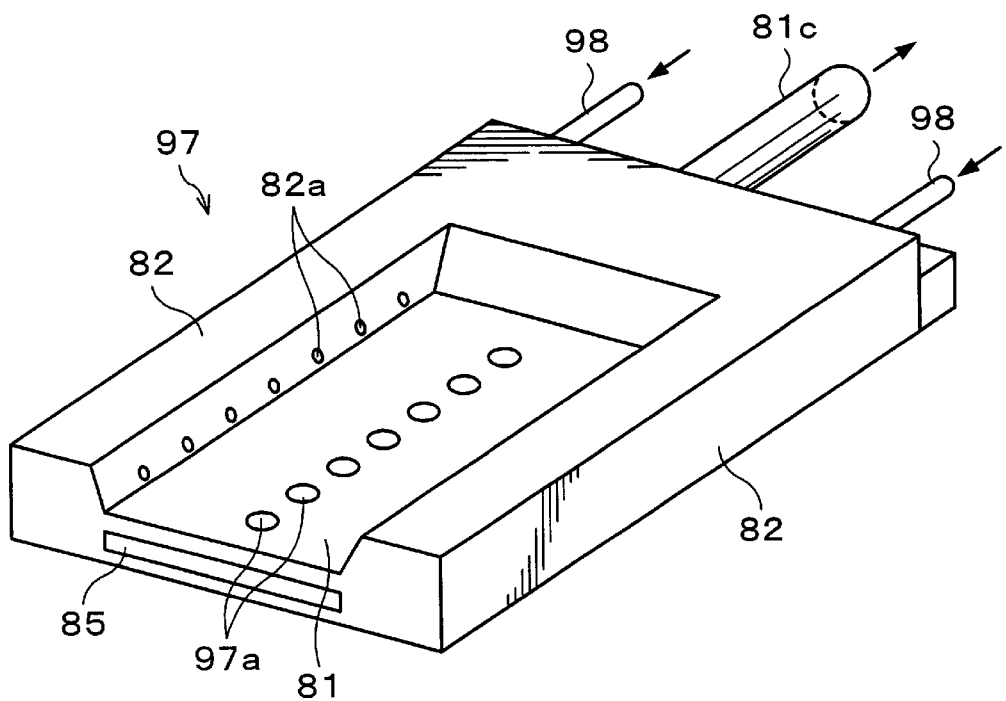
FIG. 16 is a perspective view of a mask member in another embodiment.
Figure 17:
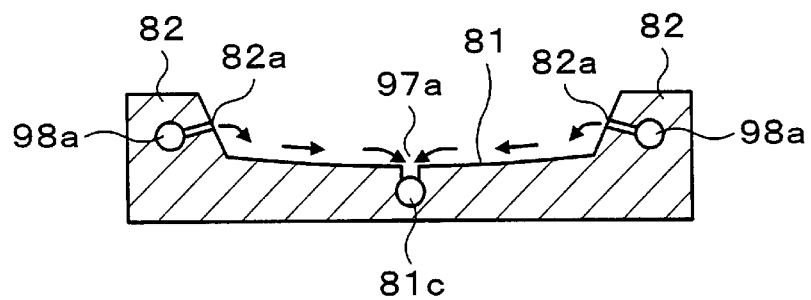
FIG. 17 is a vertical sectional view of the mask member in FIG. 16.

As another example of the mask member, a mask member 97 shown in FIG. 16 can be proposed. This mask member 97 can be used in place of the aforesaid mask member 8a. Also in the mask member 97, the top face of the liquid catching plate 81 which constitutes a liquid catcher inclines downward to the back side The liquid catching plate 81 is surrounded by the side wall 82 except the front thereof. The top face and the front end face of the liquid catching plate 81, and the inner side face of the side wall 82 touching the liquid catching plate 81 and the upper face of the side wall 82 are formed of a hydrophilic member so that the solvent spreads easily. The top face of the liquid catching plate 81 may incline so that the central portion thereof is the lowest as shown in FIG. 17.

A plurality of inlet holes 97a are provided along the longitudinal direction of the mask member 97 in the central portion of the liquid catching plate 81. The inlet holes 97a and the opening 85 communicate with the flow path 81c formed inside the liquid catching member 81, and this flow path 81c is connected to the aforesaid drain pipe 86 (See FIG. 10) at the back side as described above.

Flow paths 98a leading to solvent supply tubes 98 respectively are formed inside the side walls 82 in the mask member 97. A plurality of discharge holes 82a leading to the flow path 98a are formed at the inner side of each of the side walls 82. Hence, a solvent, for example, thinner supplied from the solvent supply tube 98 flows from the discharge ports 82a, and by way of the inner faces of the side walls 82 and the top face of the liquid catching plate 81, it is sucked from the inlet holes 97a and drained. Through this process, the inner faces of the side walls 82 of the mask member 97 and the top face of the liquid catching plate 81 are cleaned by the solvent. Consequently, even if a quick-drying treatment solution and resist solution adhere to the inner faces of the side walls 82 of the mask member 97 and the top face of the liquid catching plate 81, they can be immediately washed away.

Figure 18:
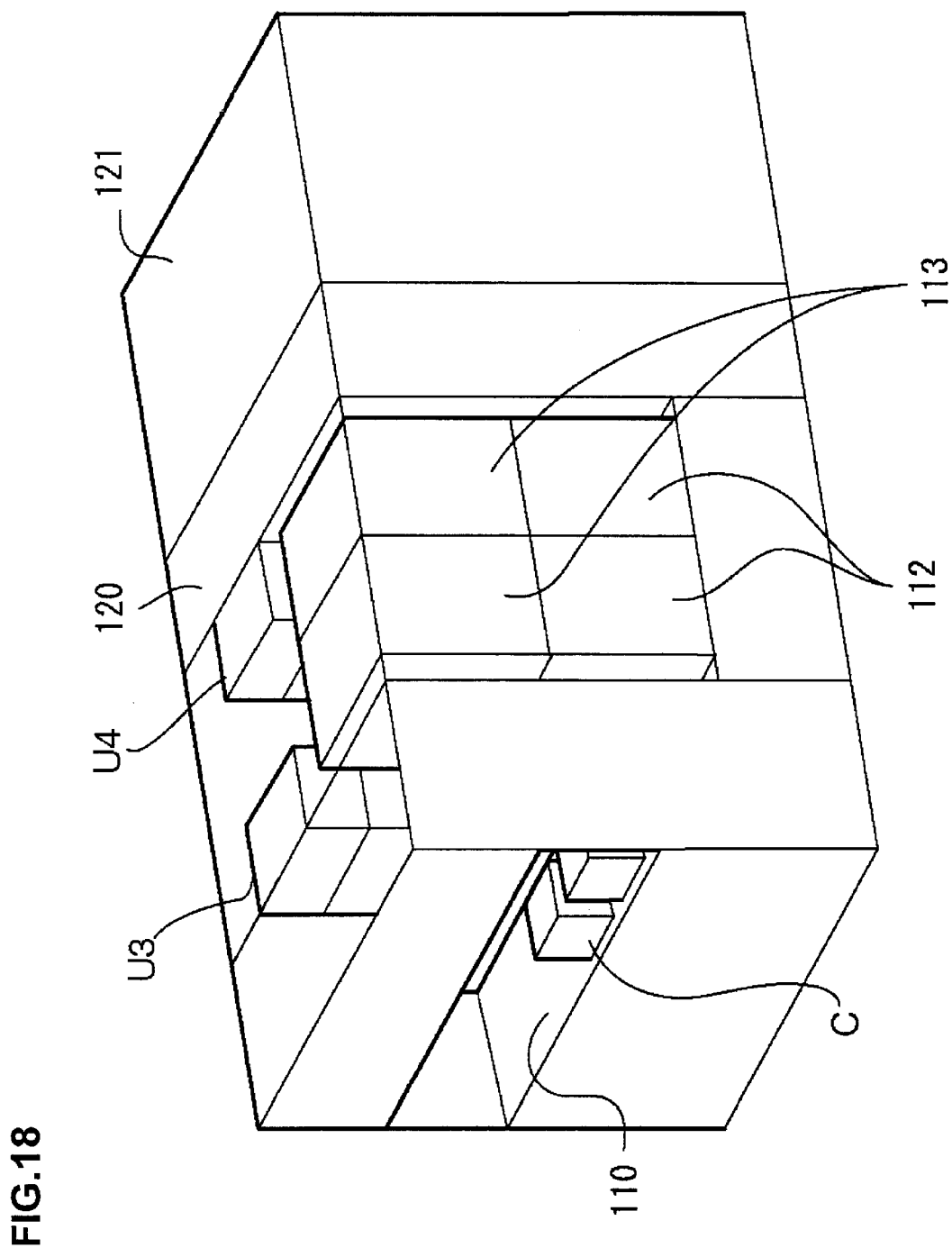
FIG. 18 is a perspective view showing an example of a coating and developing system in which a coating film forming apparatus is incorporated.
Figure 19:
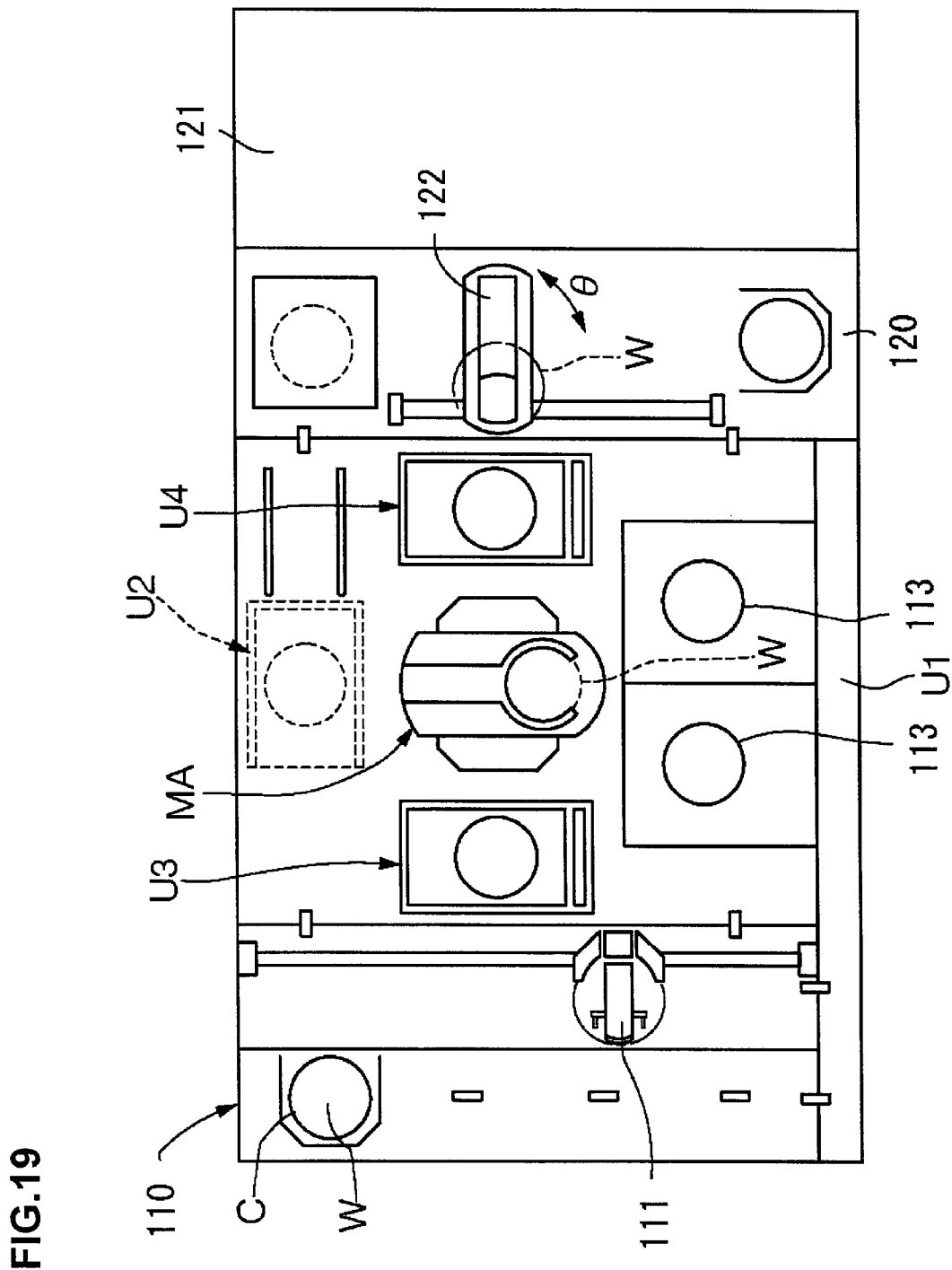
FIG. 19 is a plan view showing the example of the coating and developing system in which the coating film forming apparatus is incorporated shown in FIG. 18.

Next, an outline of an example of a coating and developing system in which the aforesaid coating film forming apparatus is incorporated as a coating unit will be given with reference to FIGS. 18 and 19. In FIGS. 18 and 19, the numeral 110 is a carrying-in/out stage for carrying a wafer cassette in/out, and a cassette C housing, for example, 25 wafers is mounted thereon, for example, by an automatic carrier robot. In a region fronting the carrying-in/out stage 110, a delivery arm 111 for the wafer W is provided to freely move in the X-, and a Z-, and the Y-direction and rotate in a θ-direction (rotate around a vertical axis). Moreover, when the inner portion is viewed from the carrying-in/out stage 110, a coating and developing system unit U1 (coating units 112 and developing units 113) is provided on the right side at the back of the delivery arm 111, and heating and cooling system units U2, U3, and U4 in each of which units are stacked in multiple tiers are disposed respectively on the left side, the front side, and the back side. Further, a wafer carrier arm MA for delivering the wafer W from/to the coating units 112 and the developing units 113 to/from the heating and cooling system units, which is structured to be ascendable and descendable, movable right and left and back and forth, and rotatable around a vertical axis, is provided. In FIG. 18, however, the unit U2 and the wafer carrier arm MA are not illustrated for convenience.

In the coating and developing system unit, for example, two of the aforesaid developing units 113 are provided at the upper tier, and two of the coating units 112 are provided at the lower tier. In the heating and cooling system units, for example, heating units, cooling units, hydrophobic treatment units, and the like are housed in the form of seven shelves in U2, U3, and U4.

When the aforesaid block including the coating and developing system unit and the heating and cooling system units is called a process station block, an aligner 121 is connected to the back side of the process station block with an interface block 120 between them. The interface block 120 is to receive and send the wafer W from/to the aligner 121, for example, by a wafer carrier arm 122 structured to be ascendable and descendable, movable right and left and back and forth, and rotatable around a vertical axis.

The flow of the wafer in this system will be explained. First, the wafer cassette C housing the wafer W is carried into the carrying-in/out stage 110 from the outside, and the wafer W is taken out of the cassette C by the wafer carrier arm 111 and delivered to the wafer carrier arm MA via a delivery table which is one of shelves in the aforesaid heating and cooling system unit U3. Subsequently, the wafer W is subjected to hydrophobic treatment in a processing section which is one shelf in the unit U3 and then coated with a resist solution in the coating unit 112, and thus a resist film is formed thereon. After the wafer W coated with the resist film is heated in a heating unit, it is carried to a cooling unit of the unit 4 capable of receiving and sending the wafer W from/to the wafer carrier arm 122 in the interface block 120, sent after treatment to the aligner 121 via the interface block 120 and the wafer carrier arm 122, and subjected to exposure through a mask corresponding to a pattern there. The wafer which has undergone exposure processing is received by the wafer carrier arm 122, and sent to the wafer carrier arm MA in the process station block via a delivery unit of the unit U4.

Thereafter, the wafer W is heated to a predetermined temperature in a heating unit, cooled to a predetermined temperature in a cooling unit, and then sent to the developing unit 113 to undergo developing treatment, and thus a resist mask is formed thereon. Thereafter, the wafer W is returned into the cassette C on the carrying-in/out stage 110.

In the above description, a substrate used in the present embodiments may be an LCD substrate. Further, a coating solution is not limited to a resist solution, and a layer insulation material, a low dielectric material, a ferroelectric material, a wiring material, a organometallic material, a metallic paste, or the like may be used.

According to the present invention, a coating film forming apparatus enabling a high yield of a coating solution, formation of a uniform coating film, moreover easy cleaning of a mask member covering an area other than a coating film formation area, and suppression of an increase in the size of the apparatus.

It is to be understood that the present invention is not interpreted with limitation to the aforesaid embodiments, and various changes based on the spirit of the present invention are also included in the technical scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An apparatus for forming a coating film on a substrate, comprising:
   a substrate holding portion configured to hold the substrate;
   a coating solution nozzle, arranged to face the substrate and discharge a coating solution to the substrate;
   a drive mechanism configured to produce relative movement between said coating solution nozzle and a surface of the substrate while the coating solution is being discharged;
   a mask unit covering a coating film non-formation area of the substrate and including a mask member configured to catch the coating solution from said coating solution nozzle and a case body movable with respect to the mask member between the positions at which the mask member is surrounded and not surrounded; and
   a cleaning mechanism provided in said mask unit and having a solvent nozzle configured to discharge a solvent to the mask member to dissolve the coating solution adhered to the mask member, remove the coating solution adhered to the mask member and clean the mask member.

2. An apparatus according to claim 1, wherein said cleaning member comprises:
   a first suction mechanism configured to remove the solvent supplied to the mask member and components of the dissolved coating film; and
   a second suction mechanism configured to remove solvent spilled from the mask member to a bottom face of the case body and the components of the dissolved coating film.

3. An apparatus according to claim 1, further comprising: an ultrasonic vibrator configured to apply an ultrasonic wave to the solvent.

4. An apparatus for forming a coating film on a substrate, comprising:
   a substrate holding portion configured to hold the substrate,
   a coating solution nozzle arranged to face the substrate held by said substrate holding and discharge a coating solution to the substrate;
   a drive mechanism configured to produce relative movement between said coating solution nozzle and a surface of the substrate while the coating solution is being discharged;
   a mask unit covering a coating film non-formation area of the substrate and including a mask member configured to catch the coating solution from said coating solution nozzle; and
   a cleaning mechanism provided in said mask unit, having a solvent nozzle configured to discharge a solvent to the mask member to dissolve the coating solution adhered to the mask member and remove the adhered coating solution from the mask member to clean the mask member, and having a drying gas supply section configured to blow a drying gas to the mask member.

5. An apparatus according to claim 4, wherein the solvent nozzle and the coating solution nozzle are joined.

6. An apparatus according to claim 4, further comprising: an ultrasonic vibrator configured to apply an ultrasonic wave to the solvent.

7. An apparatus for forming a coating film on a substrate, comprising:
   a substrate holding portion configured to hold the substrate;
   a coating solution nozzle arranged to face the substrate and discharge a coating solution to the substrate;
   a drive mechanism configured to produce relative movement between said coating solution nozzle and a surface of the substrate while the coating solution is being discharged;
   a mask unit covering a coating film non-formation area of the substrate and including a mask member configured to catch the coating solution; and
   a cleaning mechanism provided in said mask unit and having an absorber configured to absorb the coating solution.

8. An apparatus according to claim 7, wherein said cleaning mechanism comprising:
   a suction mechanism configured to remove the coating solution absorbed by the absorber.

* * * * *